(12) United States Patent
Lenz

(10) Patent No.: US 6,448,775 B1
(45) Date of Patent: Sep. 10, 2002

(54) GRADIENT AMPLIFIER WITH COMBINED CURRENT REGULATION AND DIFFERENTIAL CONTROL

(75) Inventor: Helmut Lenz, Oberasbach (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/457,794

(22) Filed: Dec. 9, 1999

(30) Foreign Application Priority Data

Dec. 9, 1998 (DE) .......................................... 198 56 800

(51) Int. Cl.$^7$ ................................................ G01V 3/00

(52) U.S. Cl. ..................... 324/322; 324/318; 324/320

(58) Field of Search ................................ 324/322, 320, 324/318, 307, 309, 312

(56) References Cited

U.S. PATENT DOCUMENTS

| 5,237,277 A | 8/1993 | Lenz ............................ 324/322 |
| 6,025,720 A | 2/2000 | Lenz et al. .................. 324/322 |

Primary Examiner—Edward Lefkowitz
Assistant Examiner—Dixomara Vargas
(74) Attorney, Agent, or Firm—Schiff Hardin & Waite

(57) ABSTRACT

Gradient amplifier for an MR tomography apparatus has a controller for current control that is connected to a modulator stage upstream before an output stage. The output stage supplies a voltage to a gradient coil connected thereto, thereby producing a coil current in the gradient coil. The controller has a comparator for comparing a reference value of the coil current to the actual value of the coil current, and a P control branch connected downstream from the comparator and an I control branch situated at the output of the P control branch. The outputs of the control branches are fed to an adder via scaling resistors. An output of a differential control stage is fed to the adder. The differential control stage emits an output voltage that relieves the controller, the output voltage being proportional to the slope of a pulse edge of the gradient coil current.

5 Claims, 3 Drawing Sheets

GRADIENT AMPLIFIER WITH COMBINED CURRENT REGULATION AND DIFFERENTIAL CONTROL

BACKGROUND OF THE INVENTION

1. Field of the Invention

The present invention, relates to a gradient amplifier for a magnetic resonance (MR) tomography apparatus of the type having a control unit connected upstream to a modulator stage before the output stage for current control, the control unit including a comparison stage for the reference (or mominal) value and the actual value of the respective gradient coil current, and having a P control branch that is connected downstream and an I control branch that is situated at the output of the control branch, the outputs of the control branches being conducted to an output sum stage via calibrating resistors.

2. Description of the Prior Art

A gradient amplifier of this type is known from the German OS 197 06 756. Aside from the relatively low ohmic resistance losses, the gradient amplifier operates on a purely inductive load. The current regulator of the amplifier already regulates the system deviation, arising during a pulse edge to zero, although a short-term overshoot of 5 to 10% of the amplitude of the pulse peak occurs depending on the switching frequency, the output stage voltage, the edge steepness and the control setting. This results in an undesirable deformation of the pulse.

In order to avoid this, an optimally high switching frequency of the output stage is desirable and a very good controller setting is necessary. Furthermore, eddy current compensation is used to minimize the undesirable deformation of the pulse, although eddy current compensation is designed not for this purpose. Despite a considerable outlay, all these measures still cannot eliminate the undesirable pulse deformations entirely.

SUMMARY OF THE INVENTION

An object of the present invention is to provide a gradient amplifier of the above type wherein undesirable pulse deformations are prevented to a large extent with only low circuitry outlay.

This object is inventively achieved in a gradient amplifier wherein a voltage is produced that relieves the controller and that is proportional to the pulse edge of the gradient coil current, this voltage being added to the controller output.

The control circuit is thus inventively combined with an additional control, whereby the control circuit is largely relieved by this additional control and then has to provide only a fine control and for the application of the resistive portion.

For this purpose in an embodiment of the invention the output of an additional differential control stage, which stage is controlled directly by the current reference value, is applied at the input of the output sum stage via a calibrating resistor.

The differential control stage preferably contains an operating amplifier, to which a resistor is connected in parallel, and which is controlled by the current reference value signal at the input of the comparison stage via a capacitor.

Analogously to the construction of the control branches, an adjustable amplifier can be connected to the operating amplifier downstream.

DESCRIPTION OF THE PREFERRED EMBODIMENTS

Figure 1:
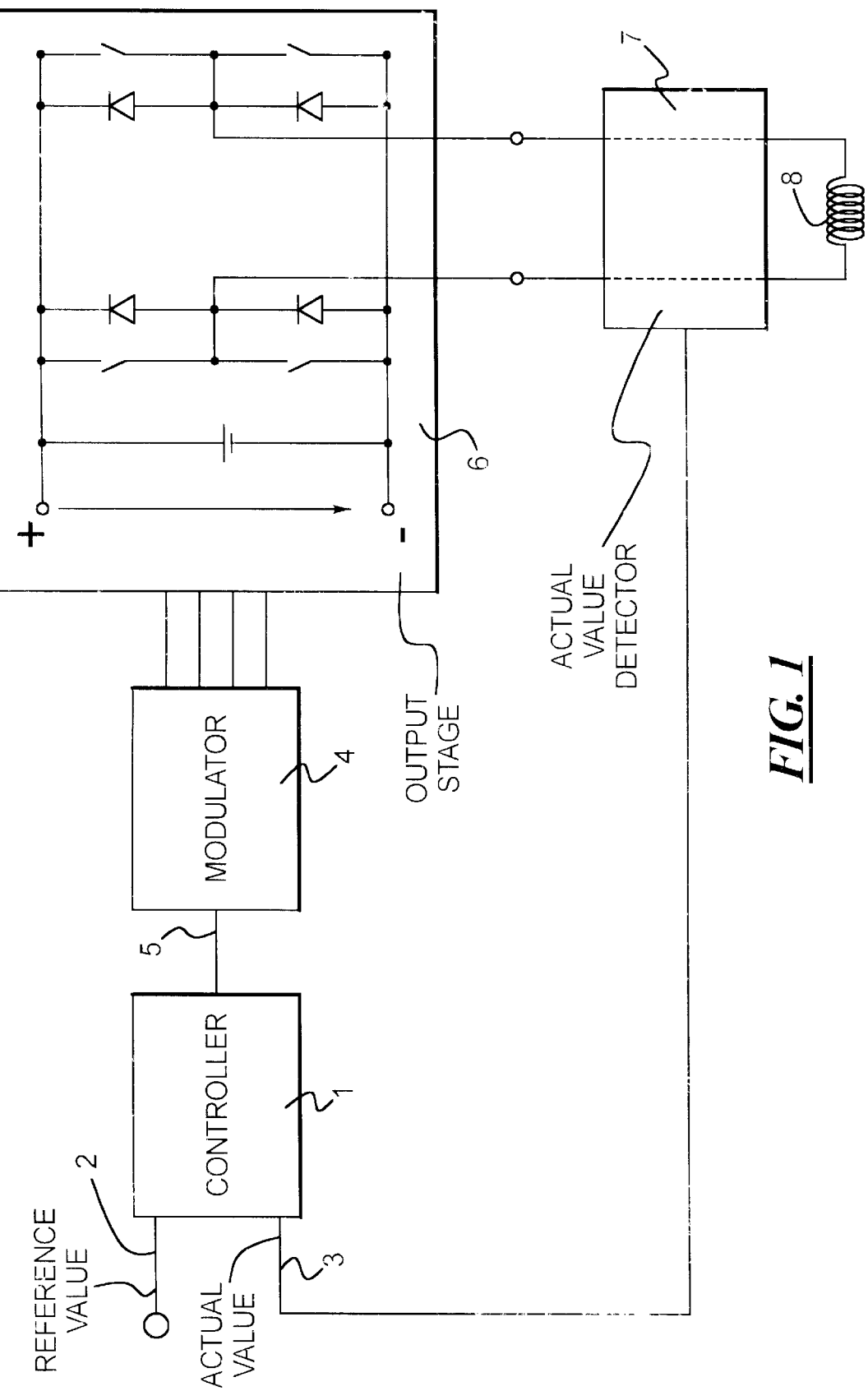
FIG. 1 is a block diagram of the control circuit of a gradient amplifier in accordance with the invention.

As seen in FIG. 1, the inventive gradient amplifier has control loop basically formed by a controller 1 with respective inputs 2 and 3 for the reference value and the actual value, a modulator 4, which converts the controller signal 5 at the output of the controller into the pulsewidth modulation of the output stage, and a switched amplifier output stage 6. The output stage 6 has an output connected to an inductive load 8 that is subject to resistive losses. The inductive load 8 is connected via an actual value detector 7, with which the load current is measured and the signal "actual value" is generated, this signal being fed to one of the two inputs of the controller 1.

Figure 2:
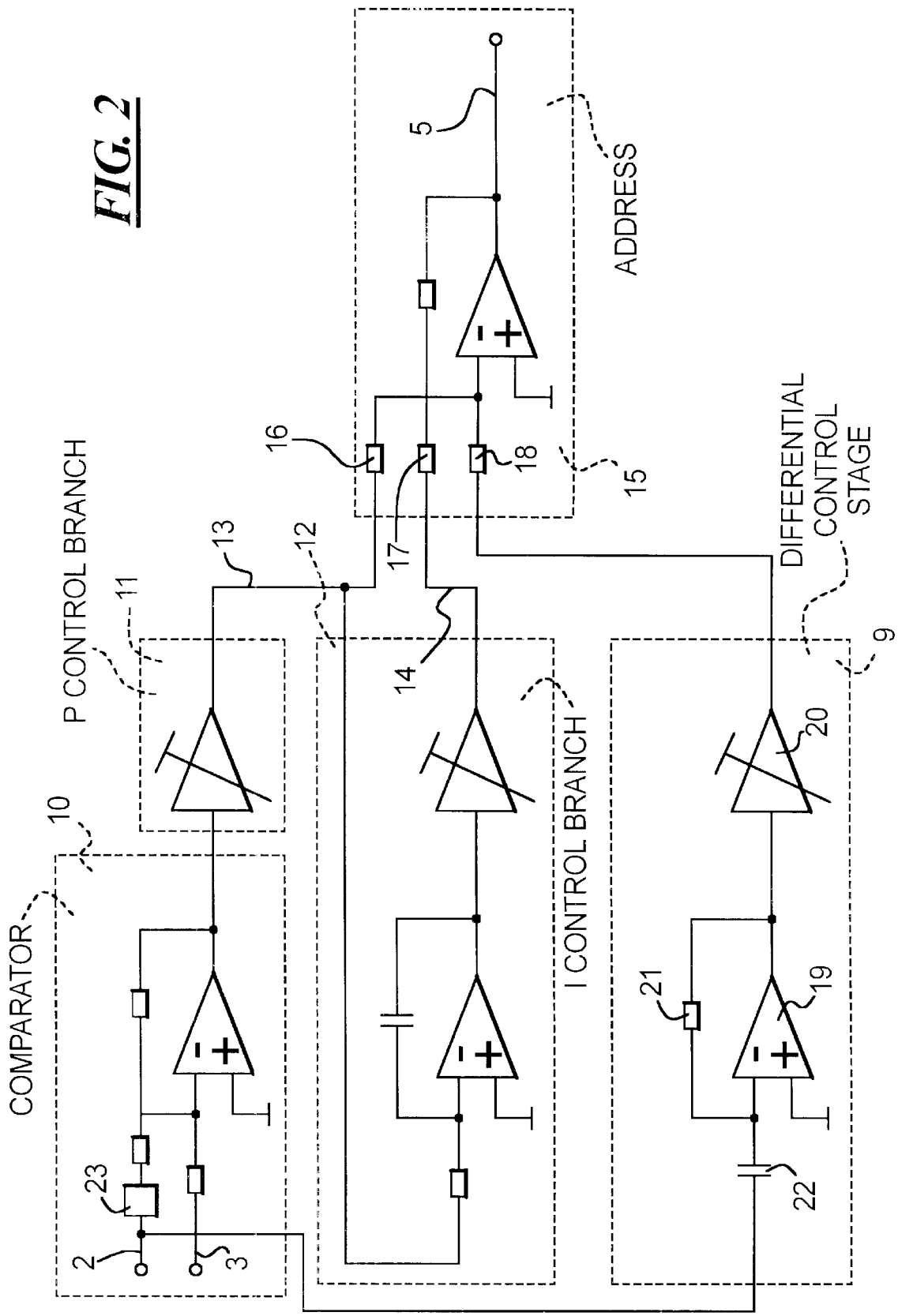
FIG. 2 is a circuit schematic of the inventive controller that is connected to the modulator upstream, with a combined differential control part.

The controller 1 is illustrated in detail in FIG. 2 and contains an additional differential control stage 9. The actual control function of the controller 1 is undertaken by a comparator 10, a P (proportional) control branch 11 that is connected downstream, an I (integral) control branch 12 that is controlled by the output 13 of the P control branch 11, and an adder 15 from which the controller output signal 5 is delivered, plus the differential control stage 9, which is described in greater detail below. In addition, a delay element 23 can be connected in the reference value input 2 of the comparator 10.

The circuitry of the actual controller having the components 10 (without the delay element 23) to 15 corresponds to the known controllers discussed above from German OS 197 06 756. This known PI-controller is digitally adjustable both in the P control branch and in the I control branch. The signals shown in FIG. 3 are achieved in a gradient pulse without the differential control stage 9 by the controller illustrated in FIG. 2.

The circuitry having the components 10 (without the delay element 23) to 15 corresponds to the known controllers discussed above from German OS 197 06 756. This known PI-controller is digitally adjustable both in the P control branch and in the I control branch. The signals shown in FIG. 3 are achieved in a gradient pulse without the differential control stage 9 by the controller illustrated in FIG. 2.

Figure 3A:
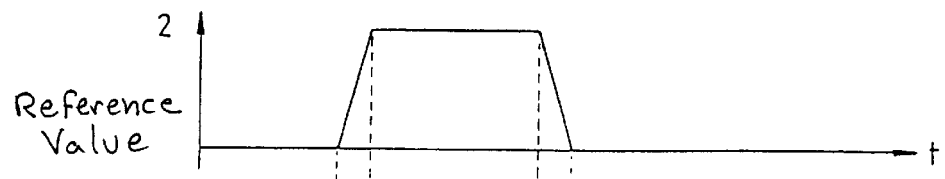
FIGS. 3a to 3f respectively illustrate the pulse shapes which occur at different locations of the inventive controller.
Figure 3B:
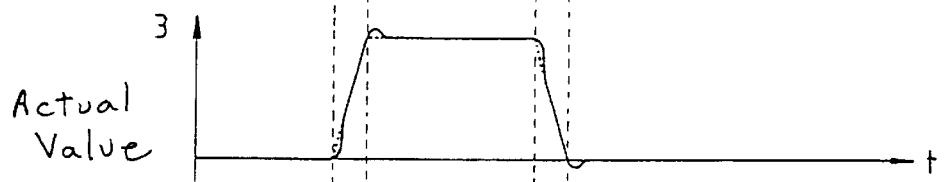

FIG. 3a depicts the reference value of a gradient pulse. The load current and thus the actual value correspond to the illustration in FIG. 3b, it being necessary for the actual value at the input 3 in the illustrated basic control circuit diagram to have a polarity that is the opposite of that reference value. For purpose of comparison, the reference value is shown in dotted lines. The actual pulse beginning is delayed relative to the reference value, but the reference value specification already can be reached at the edge. At the pulse peak an overshoot of the load current occurs. At the trailing edge a delay occurs again, and at the end of the pulse an overshoot occurs.

Figure 3C:
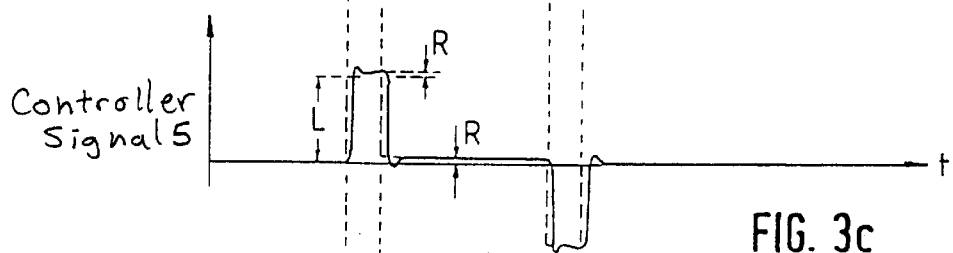

FIG. 3c depicts the controller signal 5 at the output of the controller 1, which has a characteristic corresponding to the load voltage, assuming a linear conversion in the modulator and the output stage. The controller signal 5 is composed of the sum of the P control signal 13 of the P control branch 11 and the I control signal 14 of the I control branch 12. For purpose of comparison, an ideal voltage characteristic is shown by a dashed line, with which, under ideal conditions (linear conversion of the signal in the output stage and modulator with no lag, a current characteristic corresponding to the reference value would be effectuated. In order to effectuate the current modification represented by the reference value, an increase of the load voltage by an amount "L" is required. The current that is just beginning to flow needs a rising voltage component "R". When the pulse peak is reached, only the component "R" remains as the voltage.

Figure 3D:
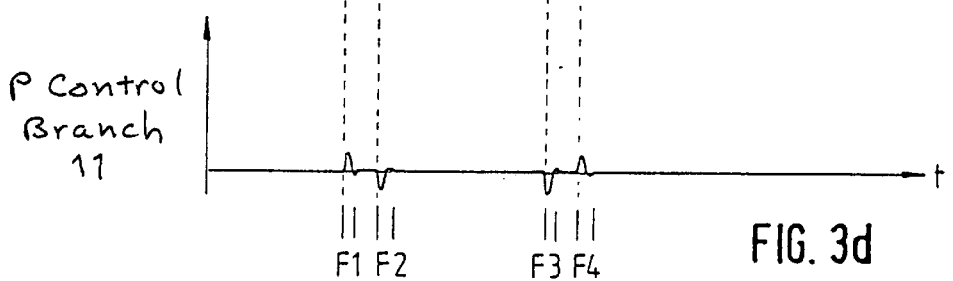
Figure 3E:
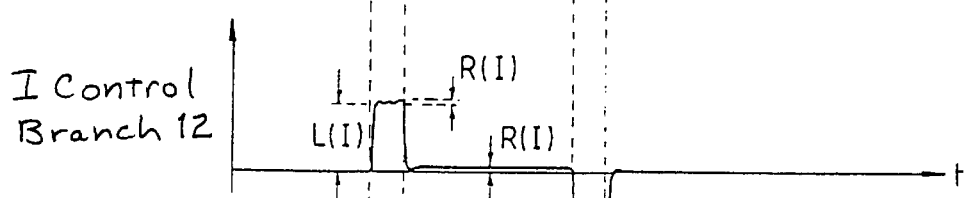

FIG. 3d illustrates the voltage characteristic of the P control branch; FIG. 3e depicts that of the I control branch. The signal characteristic in FIG. 3c is composed of the signals in FIG. 3d and FIG. 3e, scaled by the resistors 16 and 17. The P portion essentially has the contents per unit area F1 to F4 with respect to the "zero line" in FIG. 3d. A small area between F1 and F2 and between F3 and F4 is neglected. The I portion in FIG. 3e integrates the areas F1 and thus obtains the value L(I); then it integrates the neglected area between F1 and F2 and grows by R(I). The integration of the area F2 causes the I portion to drop to R(I). With the appearance of the area F2, the actual value already has reached the value specified by the reference value; the overshoot would be avoided if the controller voltage had the value "R" immediately at this instant. This is not possible, however, since the I portion for the drop to the value R(I) needs the area F2 and thus the overshoot for the down-integration.

The overshoot can only be avoided if the voltage L, or L(I) is not generated by the controller, particularly by the I branch.

Figure 3F:
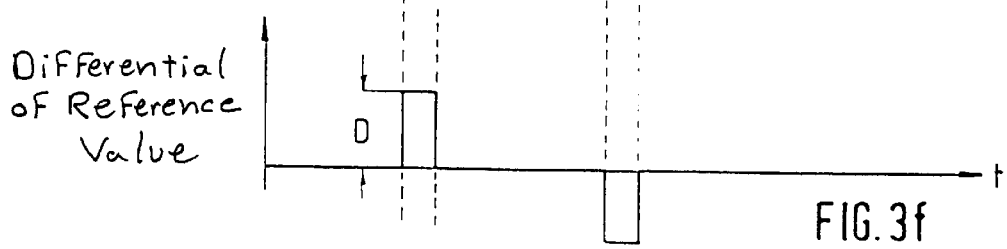

FIG. 3f illustrates the differential of the reference value; its characteristic corresponds to the ideal controller voltage from FIG. 3c without the portion R. By adding this voltage "D" in the adder 15 to the other controller signals, with an appropriate scaling by the resistor 18, the overshoot can be avoided, since it is then no longer necessary for the integrator to integrate to the value L(I) (and then down-integrate). Since the gradient coil is a linear system (semiconductors are non-linear, for example), an additional advantage is that the addition of the reference value differential to the controller signal is favorable given other current curve shapes.

FIG. 2 depicts additional differential closed loop control for the controller. A differential control stage 9 is added to the known controller having the components 10,11,12,15 from FIG. 2, this stage includes a capacitor 22, a resistor 21, an operational amplifier 19 and an adjustable amplifier 20 (preferably digitally adjustable). In the adder 15 there is an additional resistor 18, with which a scaling is again possible, that is, an adapting to the two other signals. The input signal of the differential control stage 9 is the current reference value 2 at the input of the comparator 10.

The delay element 23 (for instance a simple RC low-pass filter) additionally optimizes the effect of the differential control. The signal of the differential control stage 9 does not immediately effectuate a current actual value 3, since a small time delay occurs in the signal path due to the adder 15, the modulator 4, the output stage 6 and the current actual value detector 7. Without the delay element 23, this time delay leads to a small control difference and to a small control signal of the P and I control branches. The delay element 23 is adapted to this time delay and causes the simultaneous arrival in the comparator 10 of the now-delayed reference value (from 2) and the actual value 3 that is produced by the differential control stage, for which reason the aforementioned reaction of the P and I control branches no longer occurs.

For adjusting the controller it is helpful to assess the overshoot by itself. It is thus advantageous for the adjustable amplifier 20 in the differential control stage 9 to be adjustable to produce no amplification.

It should be reiterated that the circuit illustrated in FIG. 2 is not a PID controller. In a PID controller the differential portion is controlled dependent on the control difference. In the inventive gradient amplifier the control is accomplished by the reference value alone. Since the gradient amplifier illustrated in FIG. 1 operates by pulsewidth modulation, the actual value is subjected to a switching ripple that would be forwarded to the controller output, unnecessarily amplified by the differential portion. According to the experiments on which the invention is based, a PID controller offers hardly any advantages over a PI-controller. By contrast, the inventive differential control stage relieves the actual controller quite significantly, which, apart from a slight fine control, need yet only apply the resistive portion.

Although modifications and changes may be suggested by those skilled in the art, it is the intention of the inventor to embody within the patent warranted hereon all changes and modifications as reasonably and properly come within the scope of his contribution to the art.

I claim as my invention:

1. A gradient amplifier for a magnetic resonance apparatus, said gradient amplifier comprising:

a controller for current control having an output;

a modulator stage having an input connected to said output of said controller, and having a plurality of outputs;

an output stage having a plurality of inputs respectively connected to the outputs of said modulator stage, said output stage generating a gradient amplifier output voltage supplied to a gradient coil and thereby producing a coil current in said gradient coil;

said controller comprising a comparator for comparing a reference value of said coil current to an actual value of said coil current, said comparator having at first input supplied with said reference value, a second input supplied with an actual value of said coil current, an output at which a comparison result is present, and a proportional control branch connected to said comparator output, said proportional control branch having an output, and an integral control branch connected to said proportional control branch output, said integral control branch having an output, an adder having inputs, and the respective outputs of said integral control branch and said proportional control branch being connected to the respective inputs of said adder via scaling resistors; and a differential control stage which emits a voltage for relieving said closed loop controller which is proportional to a slope of a pulse edge of said coil current, said differential control stage having an input connected to said first input of said comparator and an output connected to an input of said adder, and said adder combining the respective outputs of said integral control branch, said proportional control branch and said voltage emitted by said differential control stage.

2. A gradient amplifier as claimed in claim 1 further comprising a scaling resistor connected between the output of the differential control stage and the input of the adder connected thereto, and said differential control stage having an input supplied with said reference value influencing said voltage emitted by said differential control stage.

3. A gradient amplifier as claimed in claim 2 wherein said differential control stage comprises an operational amplifier having a feedback input and a feedback loop, containing a resistor, connected to said feedback input, and wherein said reference value is supplied via a capacitor to said feedback input.

4. A gradient amplifier as claimed in claim 3 wherein said differential control stage further comprises an adjustable amplifier connected to an output of said operational amplifier, and preceding said scaling resistor.

5. A gradient amplifier as claimed in claim 1 further comprising a time delay element, through which said reference value is supplied, preceding said comparator in said controller.

* * * * *